(12) United States Patent  
Schmidt

(10) Patent No.: US 8,952,697 B2  
(45) Date of Patent: Feb. 10, 2015

(54) LOCAL COIL WITH OPTIMIZED DATA TRANSMISSION

(75) Inventor: Sebastian Schmidt, Weisendorf (DE)

(73) Assignee: Siemens Aktiengesellschaft, München (DE)

(*) Notice: Subject to any disclaimer, the term of this patent is extended or adjusted under 35 U.S.C. 154(b) by 524 days.

(21) Appl. No.: 13/411,251

(22) Filed: Mar. 2, 2012

(65) Prior Publication Data

US 2013/0057278 A1 Mar. 7, 2013

(30) Foreign Application Priority Data

Mar. 4, 2011 (DE) .......................... 10 2011 005 111

(51) Int. Cl.
*G01R 33/36* (2006.01)

(52) U.S. Cl.
CPC ........ *G01R 33/3692* (2013.01); *G01R 33/3621* (2013.01)
USPC ....................................................... 324/318

(58) Field of Classification Search
CPC .. G01R 33/54; G01R 33/341; G01R 33/3621; G01R 33/3692
USPC ................................................. 324/300–322
See application file for complete search history.

(56) References Cited

U.S. PATENT DOCUMENTS

| | | | |
|---|---|---|---|
| 5,086,275 A * | 2/1992 | Roemer ......................... | 324/309 |
| 5,414,359 A * | 5/1995 | Mehlkopf et al. ............. | 324/309 |
| 5,713,358 A | 2/1998 | Mistretta et al. | |
| 6,320,380 B1 * | 11/2001 | Wu et al. ....................... | 324/309 |
| 6,362,622 B1 * | 3/2002 | Stauber et al. ................ | 324/318 |
| 6,900,638 B1 * | 5/2005 | Yair et al. ...................... | 324/322 |
| 7,141,972 B2 * | 11/2006 | Avram et al. .................. | 324/309 |
| 7,671,595 B2 * | 3/2010 | Griswold et al. ............. | 324/322 |
| 8,382,699 B2 * | 2/2013 | Kassab et al. ................... | 604/43 |
| 8,610,432 B2 * | 12/2013 | Shigeta et al. ................ | 324/309 |
| 8,698,495 B2 * | 4/2014 | Nehrke et al. ................ | 324/309 |
| 2012/0139538 A1 * | 6/2012 | Schmidt et al. ............... | 324/309 |
| 2013/0082707 A1 * | 4/2013 | Biber et al. ................... | 324/309 |

FOREIGN PATENT DOCUMENTS

| | | |
|---|---|---|
| DE | 10 2010 022 522 A1 | 12/2011 |
| WO | WO 2009/147596 A1 | 12/2009 |

OTHER PUBLICATIONS

German Office Action dated Sep. 23, 2011 for corresponding German Patent Application No. DE 10 2011 005 111.2 with English translation.

* cited by examiner

*Primary Examiner* — Dixomara Vargas
(74) *Attorney, Agent, or Firm* — Lempia Summerfield Katz LLC

(57) ABSTRACT

A local coil for magnetic resonance applications receives analog magnetic resonance signals excited by an excitation signal in an examination object using a plurality of receive antennas. The local coil digitizes the received analog magnetic resonance signals and stores the digitized magnetic resonance signals in digital form in a write-in sequence in an internal local coil memory. The local coil reads the digitized magnetic resonance signals stored in the internal local coil memory out of the internal local coil memory in a read-out sequence that is different from the write-in sequence and transfers the digitized magnetic resonance signals to a control and evaluation device of a magnetic resonance unit.

20 Claims, 9 Drawing Sheets

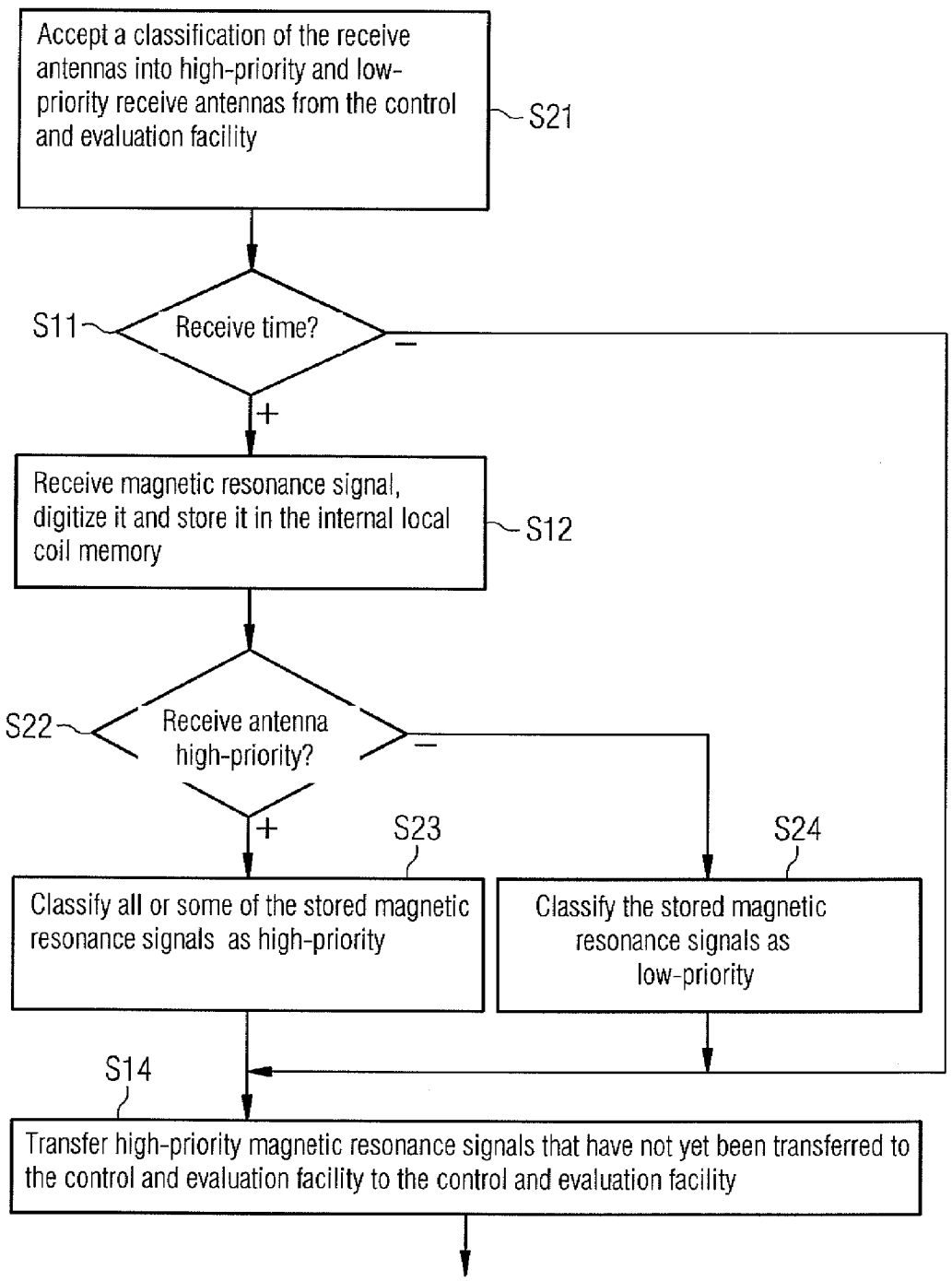

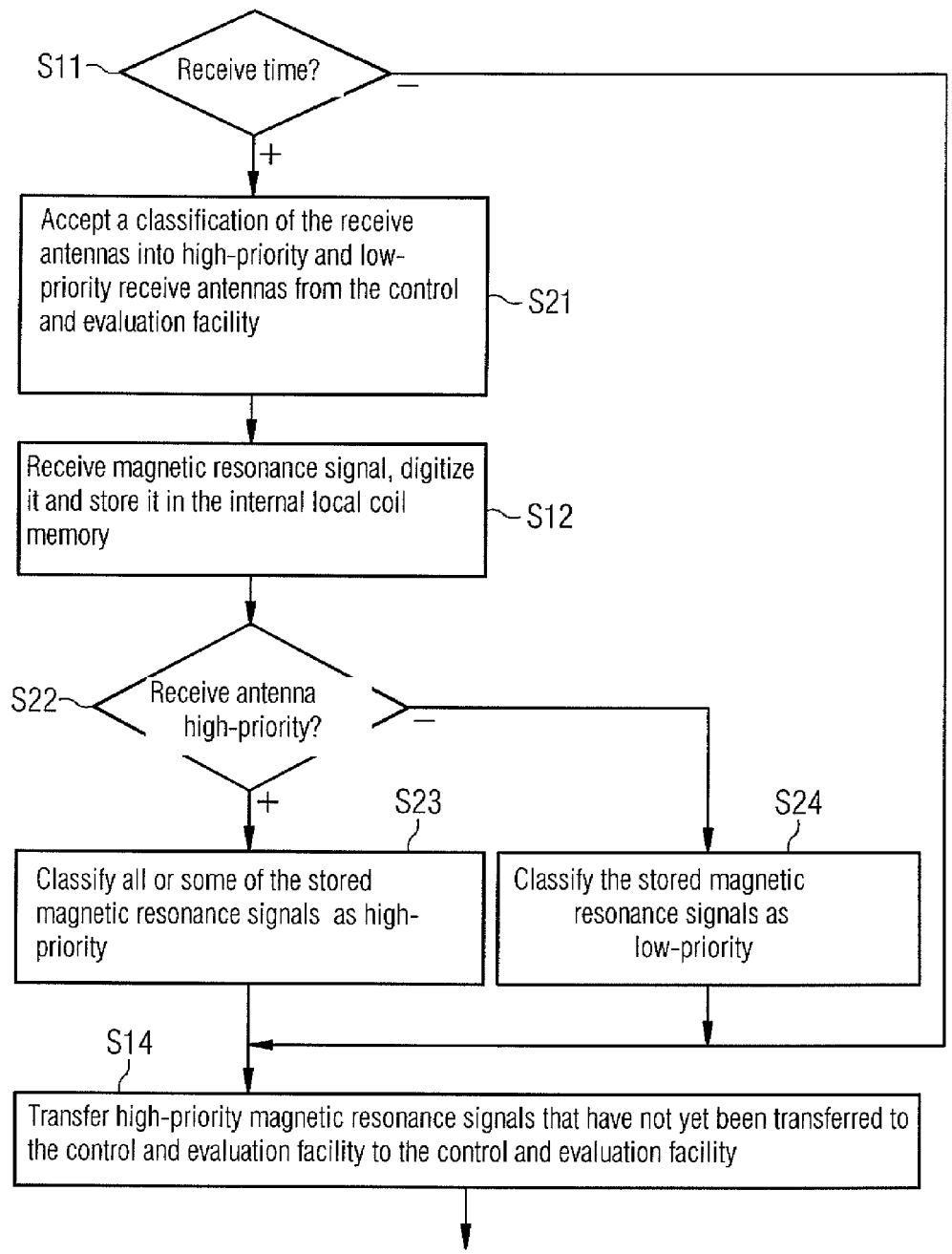

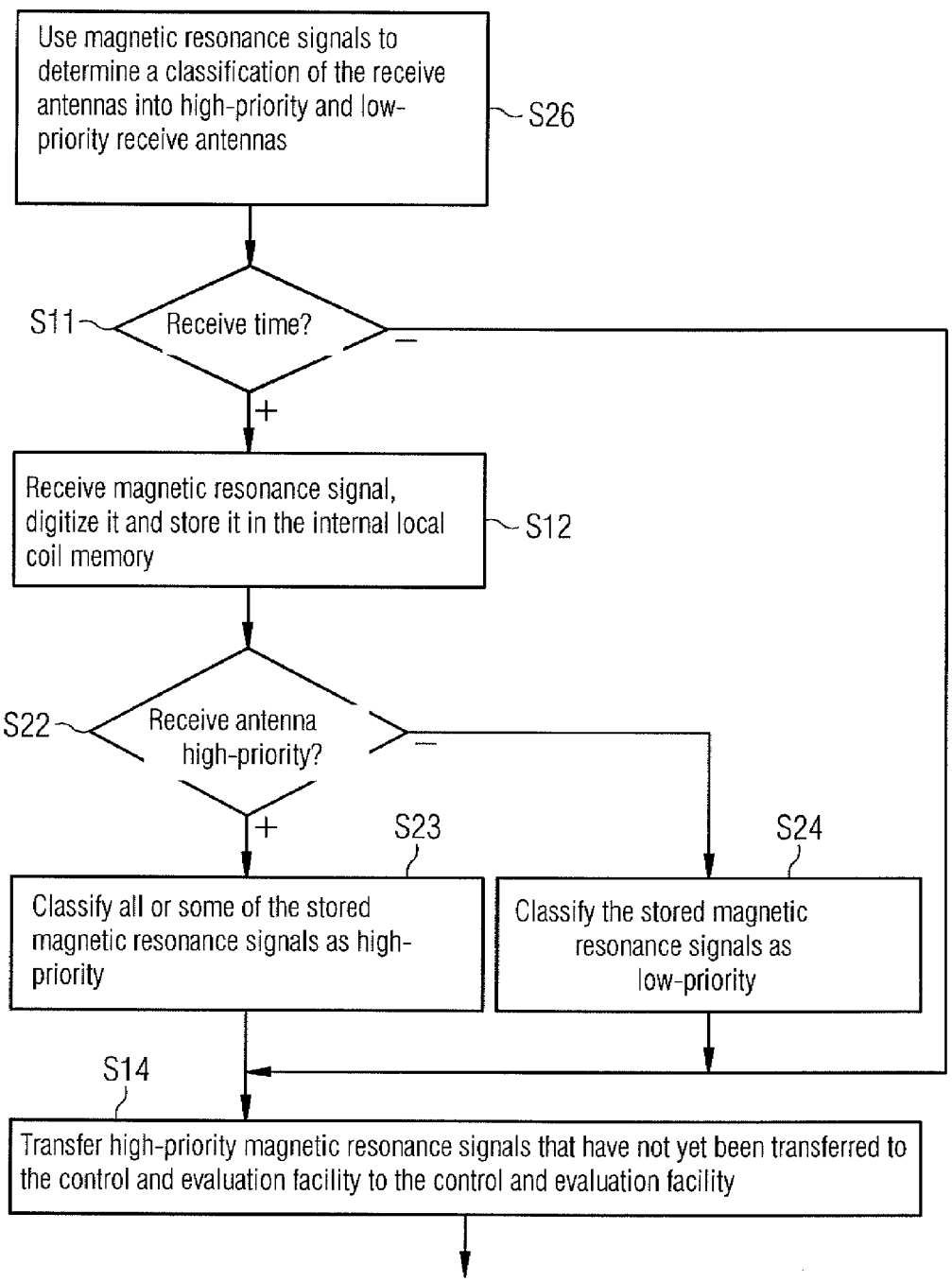

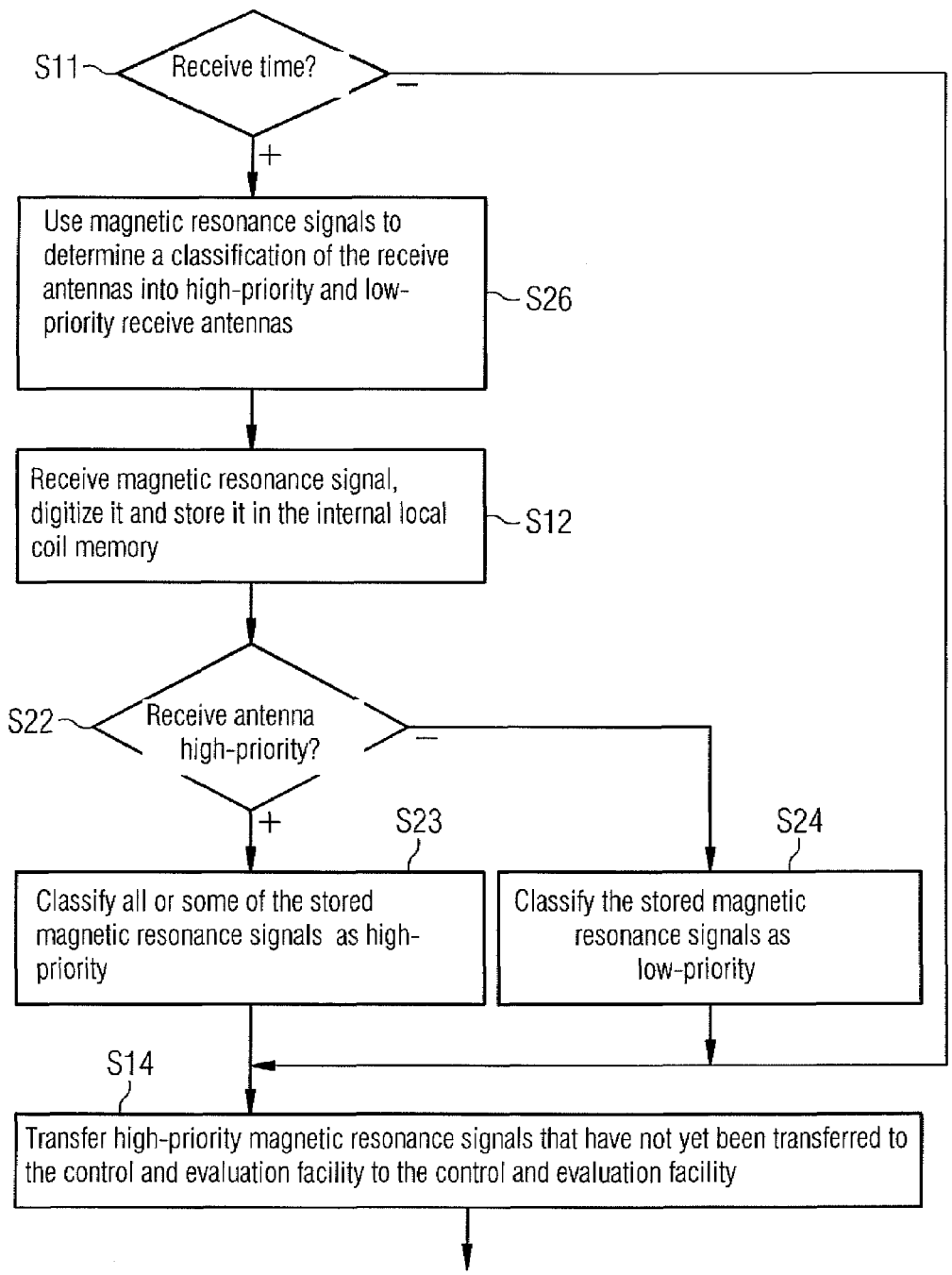

LOCAL COIL WITH OPTIMIZED DATA TRANSMISSION

This application claims the benefit of DE 10 2011 005 111.2, filed on Mar. 4, 2011.

BACKGROUND

The present embodiments relate to an operating method for a local coil for magnetic resonance applications.

Local coils may be used to receive magnetic resonance signals. The local coils may be connected by way of analog high-frequency cable connections to a control and evaluation device. The bandwidth that may be transmitted by way of the cable connections is dimensioned so that all the information may always be transmitted during measuring.

More recent research projects examine digital transmission (e.g., also by cableless local coils). With such approaches, the bandwidth for transmission from the local coil to the control and evaluation device may, in some instances, be smaller than the data rate of the magnetic resonance signal. Data transmission in real time is then no longer possible.

The German patent application DE 10 2010 022 522.3 describes a local coil for magnetic resonance applications. With the local coil, the received analog magnetic resonance signals are digitized and stored in digital form in a write-in sequence in an internal local coil memory. The stored digital magnetic resonance signals are read out of the internal local coil memory in the same sequence, in which the digital magnetic resonance signals are written into the internal local coil memory, and are transferred to the control and evaluation device. In DE 10 2010 022 522.3, the internal local coil memory is configured as a first in-first out (FIFO) memory (or is operated as such).

For many examinations and applications, the captured magnetic resonance signals need to be transferred to the control and evaluation device in real time, so that the control and evaluation device may process the magnetic resonance signals in real time and output the magnetic resonance signals to a user by way of a display device. Reference is made to catheter navigation and ablation procedures purely by way of example. If the magnetic resonance signals are to be transferred digitally for such applications, a very high data transmission rate and the very large bandwidth associated with this are required.

SUMMARY AND DESCRIPTION

The present embodiments may obviate one or more of the drawbacks or limitations in the related art. For example, image reconstruction may be achieved in real time or almost in real time despite a relatively low data transmission rate.

In one embodiment, a local coil receives analog magnetic resonance signals excited by an excitation signal in an examination object using a plurality of receive antennas. The local coil digitizes the received analog magnetic resonance signals and stores the digitized magnetic resonance signals in digital form in a write-in sequence in an internal local coil memory.

The local coil reads the digital magnetic resonance signals stored in the internal local coil memory out of the internal local coil memory in a read-out sequence that is different from the write-in sequence and transfers the digital magnetic resonance signals to a control and evaluation facility (e.g., a control and evaluation unit or device) of a magnetic resonance unit.

The local coil may be operated in a repeating measurement cycle having a receive time and a receive pause. The local coil receives the magnetic resonance signals exclusively during the receive times and stores the magnetic resonance signals in the internal local coil memory. In one embodiment, at least for a part of the measurement cycles, some of the magnetic resonance signals stored in the internal local coil memory during the respective receive time are classified as high-priority and some are classified as low-priority magnetic resonance signals, If there are any, the magnetic resonance signals stored during the respective receive time in the internal local coil memory are classified as low-priority magnetic resonance signals for the remaining part of the measurement cycles.

The local coil transfers the high-priority magnetic resonance signals first to the control and evaluation device and then transfers the low-priority magnetic resonance signals.

The local coil starts the transfer of the respective high-priority magnetic resonance signals stored in the internal local coil memory during the respective receive time to the control and evaluation device during the respective receive time. In contrast, the local coil starts, at the earliest, the transfer of the respective low-priority magnetic resonance signals stored in the internal local coil memory during the respective receive time to the control and evaluation device during the following receive pause.

Alternatively, the local coil may only transfer the low-priority magnetic resonance signals stored in the internal local coil memory during the receive times to the control and evaluation device further to a request (e.g., in response to a request) by the control and evaluation device.

In many instances, the magnetic resonance signals stored in the internal local coil memory during the receive times, as a whole, form a two or three-dimensional spatial frequency space. The high-priority magnetic resonance signals may correspond, for example, to a quadrant of the two-dimensional frequency space or to an octant of the three-dimensional spatial frequency space. Alternatively, the high-priority magnetic resonance signals may correspond to a low-frequency region of the two or three-dimensional spatial frequency space.

For complete reconstruction, the low-priority magnetic resonance signals are also transferred to the control and evaluation device. During this transfer, the low-priority magnetic resonance signals may exclusively be transferred. Alternatively, the local coil may transfer the high-priority magnetic resonance signals together with the low-priority magnetic resonance signals, a second time, to the control and evaluation device.

The number of receive antennas may be greater than one. The receive antennas receive the analog magnetic resonance signals simultaneously or quasi-simultaneously. The magnetic resonance signals may be classified, at least to some extent, as high-priority or exclusively as low-priority at least, inter alia, as a function of the receive antenna that received the magnetic resonance signals. This embodiment is possible both alternatively or in addition to a classification of a part of the spatial frequency space as high-priority.

The control and evaluation device may predefine, for the local coil, which of the receive antennas' at least to some extent, receive high-priority and which of the receive antennas exclusively receive low-priority magnetic resonance signals. Alternatively, the local coil may automatically determine, from the received magnetic resonance signals, which of the receive antennas have received or will receive, at least to some extent, high-priority and which of the receive antennas have received or will exclusively receive low-priority magnetic resonance signals.

Regardless of which of these two procedures is implemented, it is alternatively possible for the receive antennas to be reclassified statically or dynamically from measurement cycle to measurement cycle.

In one embodiment, a local coil for magnetic resonance applications is provided. The local coil includes a plurality of receive antennas, using which analog magnetic resonance signals excited by an excitation signal in an examination object may be received. The local coil has an analog-digital converter that digitizes the received analog magnetic resonance signals. The local coil also has an internal local coil memory with random access. The local coil has an electronic control system that stores the digitized magnetic resonance signals in a write-in sequence in the internal local coil memory, reads the digitized magnetic resonance signals out of the internal local coil memory in a read-out sequence that is different from the write-in sequence, and transfers the digitized magnetic resonance signals to a control and evaluation device of a magnetic resonance unit according to the read-out sequence.

The local coil is therefore configured so that the local coil operates according to an operating method of the present embodiments. The local coil may be configured so that the local coil operates according to an operating method according to one of the advantageous embodiments of the operating method described above.

In another embodiment, a magnetic resonance unit that has one embodiment of a local coil and a control and evaluation device is provided. The local coil and the control and evaluation device interact according to an operating method of the present embodiments.

BRIEF DESCRIPTION OF THE DRAWINGS

FIGS. 9 to 12 show flow charts of embodiments of a method for operating a local coil for magnetic resonance applications.

DETAILED DESCRIPTION OF THE DRAWINGS

Figure 1:
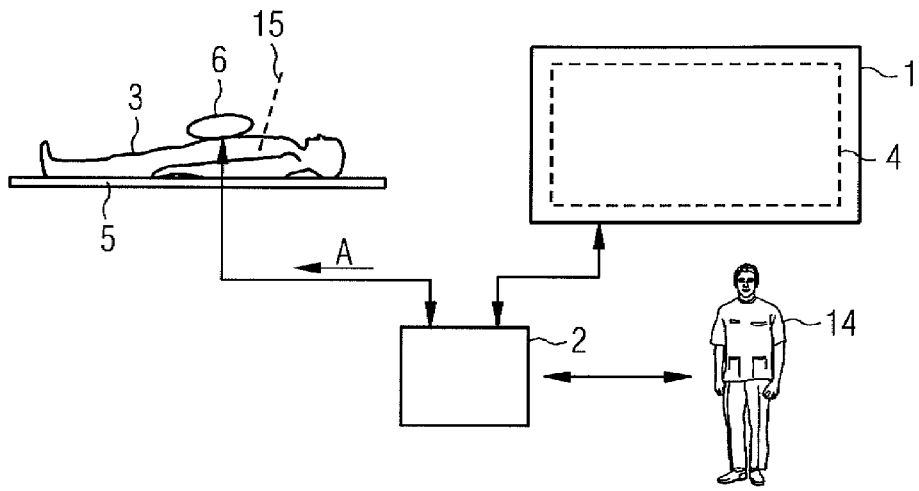
FIG. 1 shows a schematic diagram of a magnetic resonance unit.

According to FIG. 1, a magnetic resonance unit has a magnetic resonance tomography device 1 (e.g., with basic magnet, gradient magnet system, whole body transmit coil, etc.). The magnetic resonance unit also has a control and evaluation device 2.

An examination object 3 is introduced into an examination volume 4 of the magnetic resonance tomography device 1. By way of example, the examination object 3 (e.g., a person) is positioned on a patient couch 5 and is introduced using the patient couch 5 into the examination volume 4. An excitation signal is applied to the examination object 3 (e.g., by the whole body coil). The excitation signal excites the examination object 3 to emit magnetic resonance signals.

The magnetic resonance signal (e.g., see act S1 in FIG. 2) is received by a local coil 6 of the magnetic resonance unit. The local coil 6 (see FIG. 3) has a plurality of receive antennas 7, using which the magnetic resonance signals are received.

The magnetic resonance signals received by the receive antennas 7 are analog signals. The analog signals are fed (e.g., by way of a multiplexer 8 and one or more preamplifiers 9) to an analog-digital converter 10 that (see act S2 in FIG. 2) digitizes the received analog magnetic resonance signals and feeds the digitized analog magnetic resonance signals to an electronic control system 11 of the local coil 6. The electronic control system 11 stores the digital magnetic resonance signals fed to the electronic control system 11, according to FIG. 2, in an act S3 in a write-in sequence (e.g., in the sequence, in which the digital magnetic resonance signals arrive) in an internal local coil memory 12.

The local coil 6 also uses the electronic control system 11 (see act S4 in FIG. 2) to read the digital magnetic resonance signals stored in the internal local coil memory 12 out of the internal local coil memory 12 and transfers the digital magnetic resonance signals to the control and evaluation device 2. The transfer may take place either by wire or, for example, wirelessly.

If the transmission takes place wirelessly, the electronic control system 11 feeds the read-out magnetic resonance signals to a transmit stage 13 that is operated at a carrier frequency 1. A base signal of the transmit stage 13 oscillating at the carrier frequency f is thus modulated according to the magnetic resonance signal fed to the transmit stage 13. The carrier frequency f may be, for example, in the GHz range (e.g., in the two-digit GHz range). In the case of wired transmission, this embodiment is also possible but not necessary.

The reading out and transferring of the magnetic resonance signals to the control and evaluation device 2 takes place in a read-out sequence that is different from the write-in sequence. For example the magnetic resonance signals may be written into the internal local coil memory 12 in the sequence A1 ... An, B1 ... Bn, ..., Z1 ... Zn and may be read out of the internal local coil memory 12 in the sequence A1 ... Z1, A2 ... Z2, ..., An ... Zn. In order to be able to implement the different read-out sequence from the write-in sequence, the internal local coil memory 12 is configured as a memory with random access.

Figure 4:
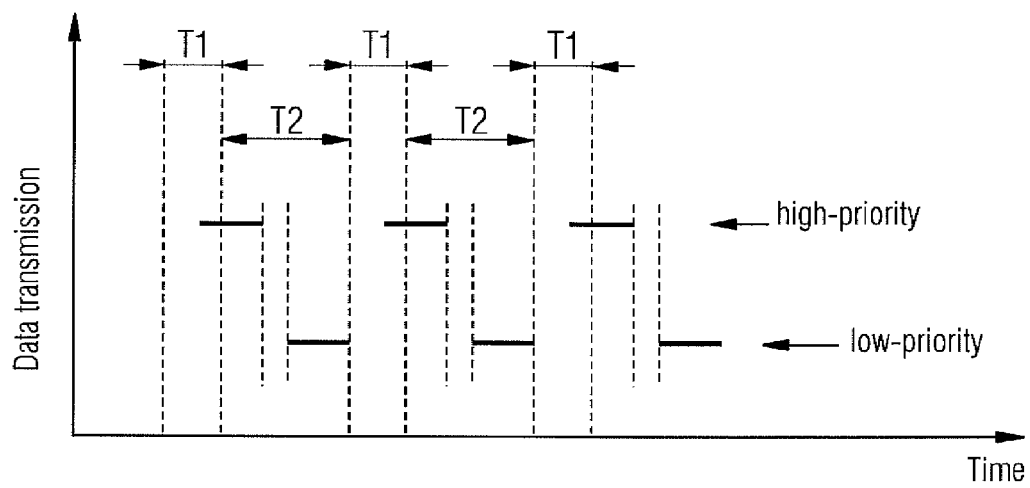
FIG. 4 shows an exemplary sequence of measurement cycles.

A series of repeating measurement cycles may, for example, be executed in magnetic resonance units. According to FIG. 4, the measurement cycles have a receive time T1 and a receive pause T2. The receive times T1 may be of identical length. The receive pauses T2 may be of identical length. Alternatively, the receive times T1 and the receive pauses T2 may be of different length.

The excitation of the examination object 3 to magnetic resonances takes place (inter alia) during the receive pauses T2. During the receive times T1 (e.g., exclusively during the receive times T1), according to acts S11 and S12 in FIG. 5, the magnetic resonance signals are received by the local coil 6 and the received and digitized magnetic resonance signals are stored in the internal local coil memory 12.

In act S13, the electronic control system 11 classifies the magnetic resonance signals stored in the internal local coil memory 12 during the respective measurement cycle as high-priority and low-priority magnetic resonance signals. The following instances are possible.

In all the measurement cycles, some of the respectively stored magnetic resonance signals are classified as high-priority, with the (not empty) remainder being classified as low-priority.

In part of the measurement cycles, some of the respectively received magnetic resonance signals are classified as high-priority, with the (not empty) remainder being classified as low-priority. In the remaining measurement cycles, all the respectively stored magnetic resonance signals are classified as low-priority.

This is examined in more detail below.

In act S14, a transmission of high-priority magnetic resonance signals takes place if the high-priority magnetic resonance signals are available for transmission (i.e., are stored in the internal local coil memory 12 but have not yet been transferred to the control and evaluation device 2).

In act S15, the electronic control system 11 checks whether the transfer of the high-priority magnetic resonance signals is completed. Only if this condition is satisfied are the low-priority magnetic resonance signals transferred to the control and evaluation device 2 in act S16.

In act S16, the low-priority magnetic resonance signals may exclusively be transferred to the control and evaluation device 2. Alternatively, as illustrated in act S16, the high-priority magnetic resonance signals are transmitted together with the low-priority magnetic resonance signals a second time to the control and evaluation device 2.

The transfer of the high-priority magnetic resonance signals to the control and evaluation facility 2 is started as early as possible. In the embodiment according to FIG. 4, the local coil 6 starts the transfer of the respective high-priority magnetic resonance signals stored in the internal local coil memory 12 during the respective receive time T1 to the control and evaluation device 2 during the respective receive time T1. In contrast, the local coil 6 starts the transfer of the respective low-priority magnetic resonance signals stored in the memory 12 during the respective receive time T1, at the earliest, during a following receive pause T2, according to FIG. 4.

Figure 5:
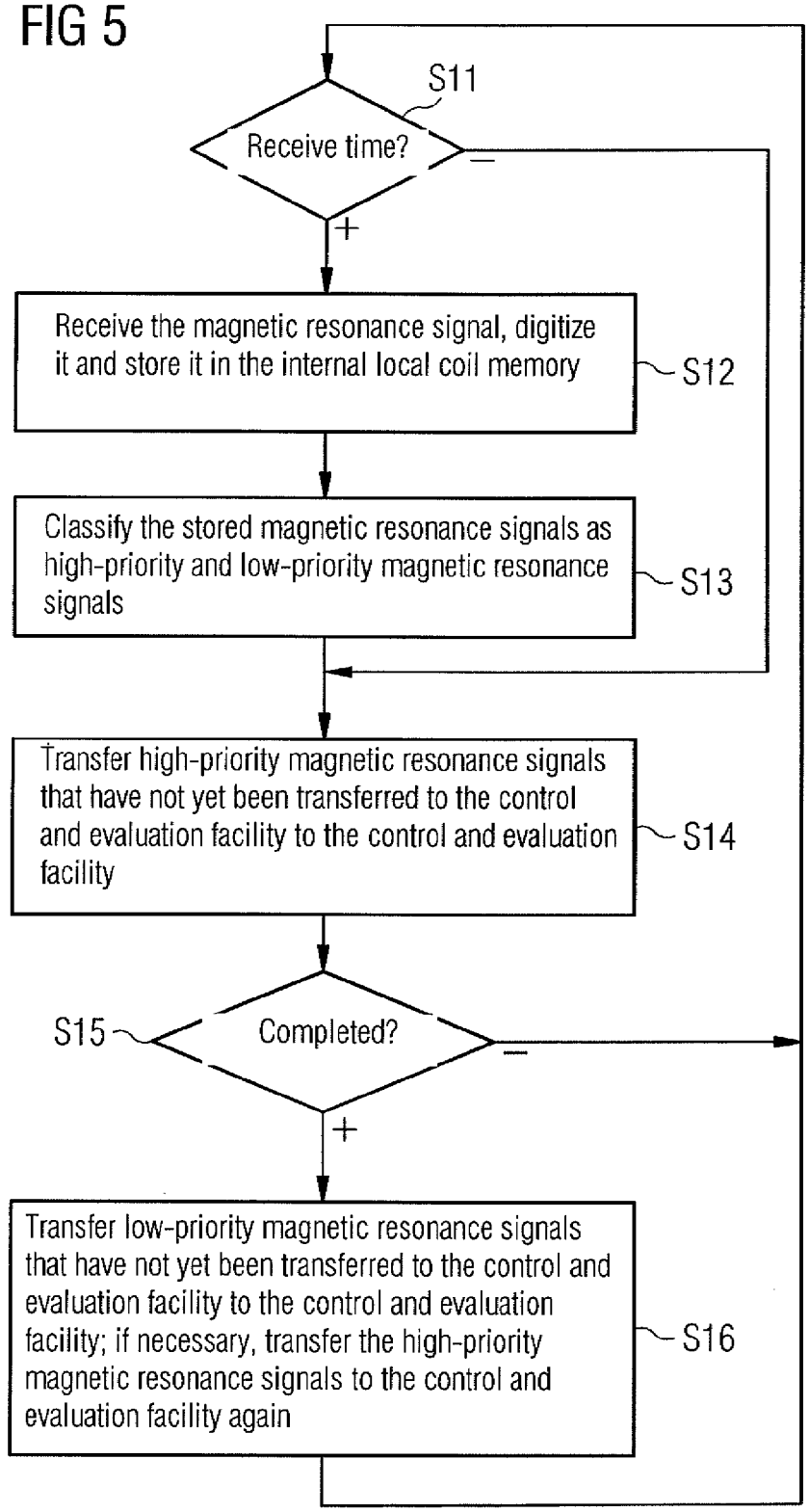
FIGS. 5 and 6 show flow charts of embodiments of a method for operating a local coil for magnetic resonance applications.
Figure 6:
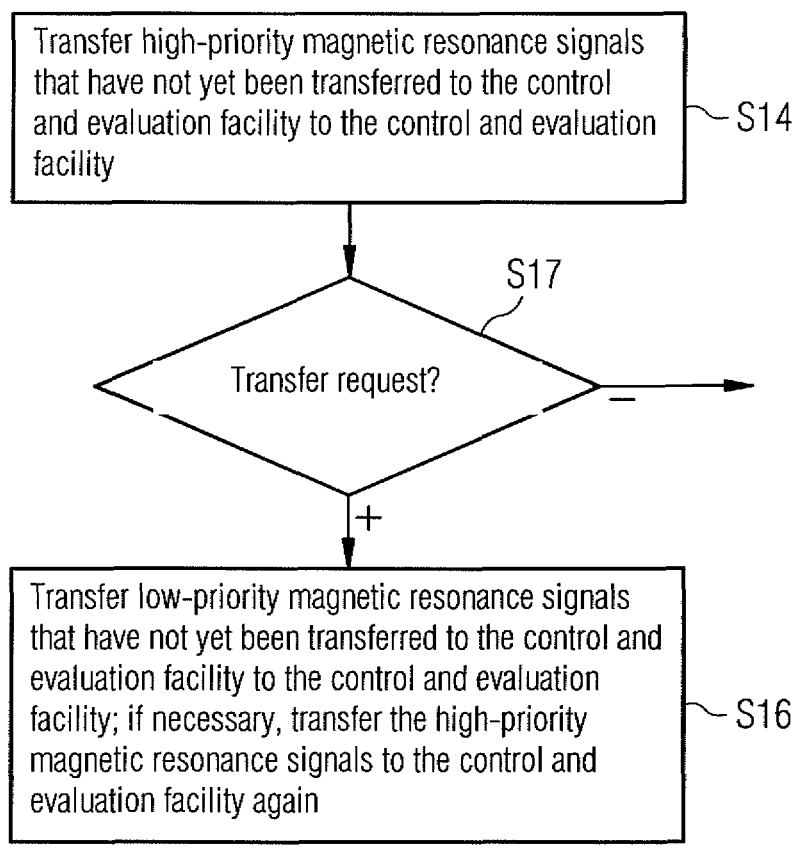

In one embodiment, the local coil 6 may only transfer the low-priority magnetic resonance signals stored in the memory 12 during the receive times T1 to the control and evaluation device 2 further to a request A (see FIG. 3) by the control and evaluation device 2. Act S15 in FIG. 5 is then extended or replaced (see FIG. 6) by act S17, in which the electronic control system 11 checks whether the corresponding request A has been transferred to the electronic control system 11 from the control and evaluation device 2.

The capturing of magnetic resonance signals takes place in the spatial frequency space (e.g., the k-space). The k-space may be either two-dimensional or three-dimensional.

Figure 7:
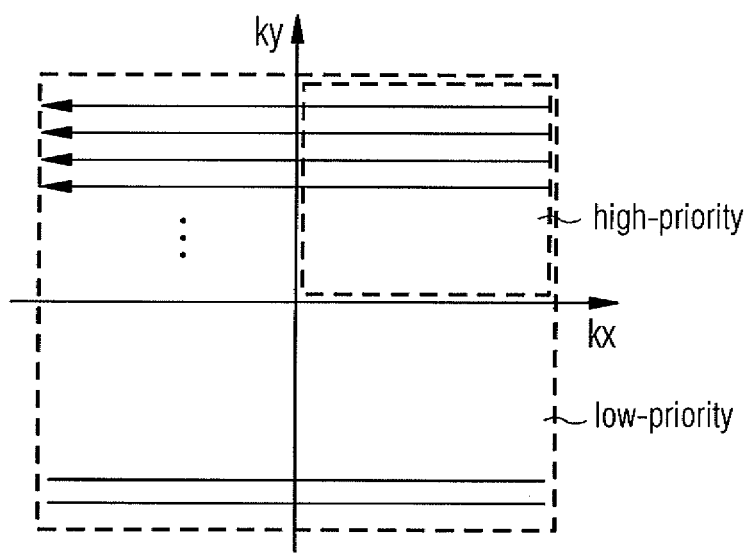
FIGS. 7 and 8 show exemplary spatial frequency spaces.

FIG. 7 shows a schematic diagram of a two-dimensional k-space with the spatial frequency directions kx and ky. According to FIG. 7, the magnetic resonance signals, which each correspond to a row of the k-space, are captured one after the other (e.g., see the arrows in FIG. 7). According to FIG. 7 (see the correspondingly designation region in FIG. 7), the parts of the captured magnetic resonance signals that correspond to a quadrant of the k-space are classified as high-priority, with the other parts being classified as low-priority. If the k-space is three-dimensional, an octant is correspondingly classified as high-priority. After being transferred to the transmit and evaluation device 2, the high-priority data may be mirrored by this many times. This allows image reconstruction over the entire field of view FOV. Only the signal to noise ratio SNR is somewhat poorer.

Figure 8:
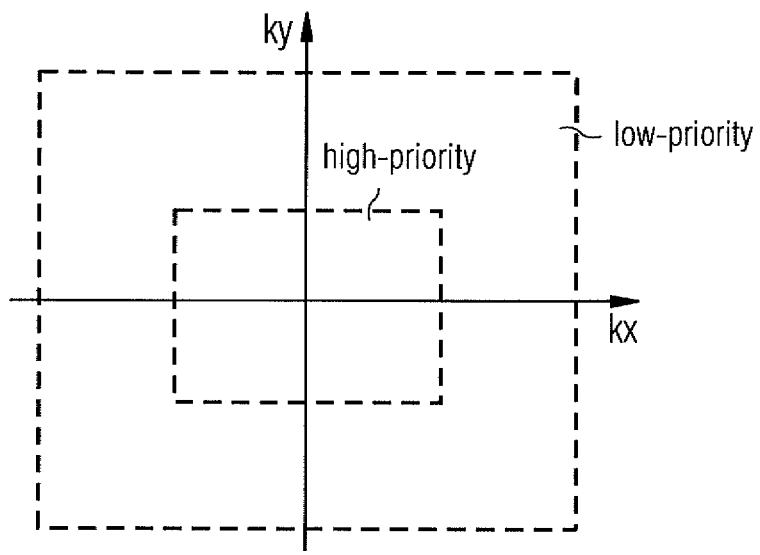

FIG. 8 also shows a two-dimensional k-space. The k-space may alternatively be three-dimensional. According to FIG. 8, the high-priority magnetic resonance signals correspond to a low-frequency region of the spatial frequency space. An image reconstruction over the entire field of view is also possible using the high-priority magnetic resonance signals exclusively. Only the spatial resolution is reduced.

Figure 2:
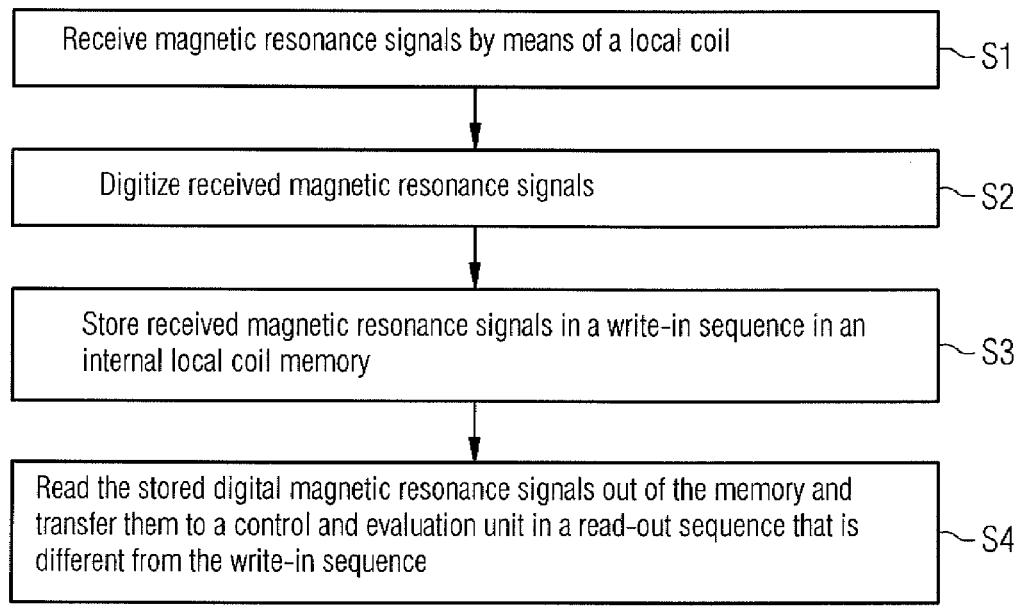
FIG. 2 shows a flow chart of one embodiment of a method for operating a local coil for magnetic resonance applications.
Figure 3:
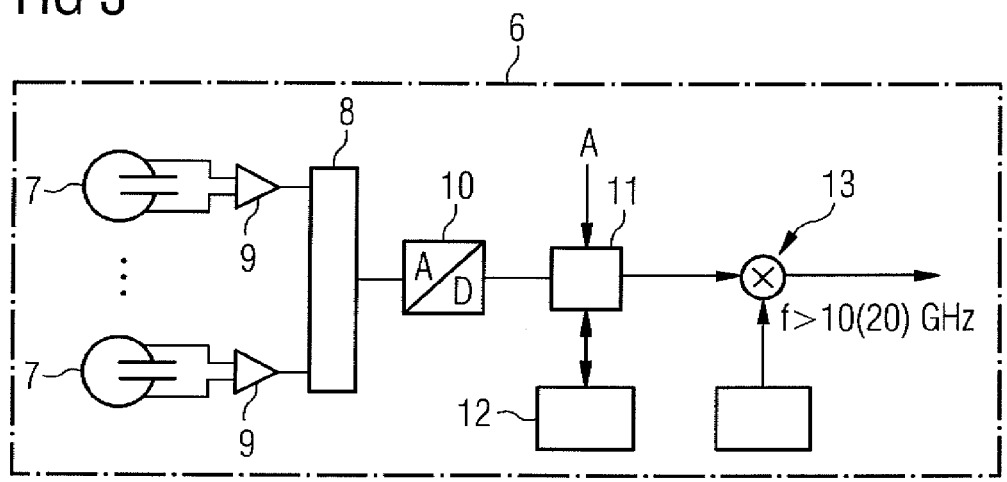
FIG. 3 shows a schematic diagram of one embodiment of a local coil.

As shown in the embodiment of FIG. 2, the number of receive antennas 7 may be greater than one. The receive antennas 7 each receive an analog magnetic resonance signal, simultaneously or quasi-simultaneously. A further possibility for classifying the magnetic resonance signals as high-priority and low-priority, according to FIG. 9, is for the control and evaluation device 2 to predefine for the local coil 6, which of the receive antennas 7 (to some extent or always) supply high-priority magnetic resonance signals and which of the receive antennas 7 exclusively supply low-priority magnetic resonance signals (see also act S21 in FIG. 9).

Which of the receive antennas 7 supply high-priority magnetic resonance signals may be predefined for the control and evaluation device. For example, a user 14 may predefine this for the control and evaluation device 2. Alternatively, the corresponding information may be predefined for the control and evaluation device 2 by intervention devices 15, which are used to perform an interventional therapy on the examination object 3. The control and evaluation device 2 may also first undertake an image reconstruction based on the transmitted high-priority magnetic resonance signals and then output the determined image to the user 14, so that the determined image may be used to decide which receive antennas 7 will, in the future, supply high-priority magnetic resonance signals. In individual instances, the control and evaluation device 2 may evaluate the determined images automatically and make the corresponding decisions.

If the control and evaluation device 2 predefines, for the local coil 6, which of the receive antennas 7 supply high-priority magnetic resonance signals, according to FIG. 9, act S13 in FIG. 5 is implemented in the form of acts S22 to S24. In act S22, the electronic control system 11 checks whether the magnetic resonance signals about to be stored are magnetic resonance signals originating from a receive antenna 7 classified as high-priority. If so, the electronic control system 11 classifies some of the corresponding magnetic resonance signals in act S23 as high-priority. Otherwise, the electronic control system 11 classifies all the corresponding magnetic resonance signals in act S24 as low-priority.

FIG. 10 shows the same acts as FIG. 9. Only the sequence of acts S11 and S21 is changed. In the embodiment according to FIG. 10, the receive antennas 7 are thus reclassified dynamically from measurement cycle to measurement cycle, while the classification of the receive antennas 7 in the embodiment according to FIG. 9 is static.

FIGS. 11 and 12 essentially correspond to FIGS. 9 and 10. However, act 21 is replaced by act S26. In act S26, the local coil 6 automatically determines which of the receive antennas 7 has received or will receive at least some high-priority magnetic resonance signals and which of the receive antennas 7 has received or will receive, exclusively, low-priority magnetic resonance signals. The determination is undertaken by the local coil 6 based on the received magnetic resonance signals, either for the magnetic resonance signals just received or for the magnetic resonance signals to be received next. Other procedures for determining the receive antennas 7, which (always or in some instances) supply high-priority magnetic resonance signals, are also possible. The intervention device 15 (e.g., a catheter or biopsy needle) may emit a signal that is located by the local coil 6. Depending on the location the local coil 6, the intervention device 15 determines which receive antennas 7 are classified as high-priority. Classification is also possible as a function of the position of the receive antennas 7, the signal strength or the change in signal strength over time.

The present embodiments have many advantages. For example, possibilities for medical applications emerge as a result of the procedures of the present embodiments. For example, real time capability may be achieved despite digital data transmission, even though the data rate at which the data is transferred from the local coil 6 to the control and evaluation device 2 is lower than the data rate at which the data arrives when the magnetic resonance signals are received in the local coil 6. The magnetic resonance signals transmitted as high-priority beforehand may also, for example, be used for image reconstruction, and the prior image reconstruction may, for example, be used to decide further measures (e.g., gating or triggering). This may be used, for example, in conjunction with cardiac self gating or with respiratory navigators. In these two instances, for example, the magnetic resonance signals of the receive antennas 7, in which the magnetic resonance signals demonstrate the greatest periodic change over time at a certain frequency, may be sent first. The frequency is selected according to the application. Transmission of the low-priority magnetic resonance signals may also be undertaken as required. For example, the low-priority magnetic resonance signals may be transmitted during the excitation times/receive pauses T2, between image series or after the end of an examination. In such instances, only the internal local coil memory 12 is to be of sufficiently large dimensions.

Which part of the low-frequency spatial frequency space is transmitted may be decided as a function of the provisionally reconstructed images. Where there are small differences (e.g., no motion or only slow motion), more data may be transmitted, for example, per data record in the k-space than with greater motion. This is appropriate for human visual sensitivity, as noise is perceived less in images with significant motion.

A further advantage is that image reconstruction (e.g., over the entire field of view) is already possible with the high-priority magnetic resonance signals. To speed things up more, different reconstruction methods can be used, for example, for the high-priority magnetic resonance signals and a set of high and low-priority magnetic resonance signals. For example, the high-priority magnetic resonance signals are processed using a fast Fourier algorithm, while an iterative algorithm is used for the image reconstruction of all the image data.

The above description serves solely to explain the present embodiments. The scope of protection of the present invention is to be determined solely by the accompanying claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a local coil for magnetic resonance applications, the method comprising:
   receiving, at the local coil, analog magnetic resonance signals excited by an excitation signal in an examination object using a plurality of receive antennas;
   digitizing, by the local coil, the received analog magnetic resonance signals;
   storing the digitized magnetic resonance signals in digital form in a write-in sequence in an internal local coil memory;
   reading the digitized magnetic resonance signals stored in the internal local coil memory out of the internal local coil memory in a read-out sequence that is different from the write-in sequence; and
   transferring the digitized magnetic resonance signals to a control and evaluation device of a magnetic resonance unit.

2. The method as claimed in claim 1, wherein the local coil is operated in a repeating measurement cycle having a receive time and a receive pause,
   wherein the local coil receives the analog magnetic resonance signals exclusively during the receive times and stores the analog magnetic resonance signals in the internal local coil memory,
   wherein at least for a part of the measurement cycles, some of the digitized magnetic resonance signals stored in the internal local coil memory during the respective receive time are classified as high-priority and some as low-priority magnetic resonance signals,
   wherein the digitized magnetic resonance signals stored during the respective receive time in the internal local coil memory are classified as low-priority magnetic resonance signals for a remaining part of the measurement cycles, and
   wherein the local coil first transfers the high-priority magnetic resonance signals to the control and evaluation facility and then transfers the low-priority magnetic resonance signals to the control and evaluation device.

3. The method as claimed in claim 2, wherein the local coil starts the transfer of the respective high-priority magnetic resonance signals stored in the internal local coil memory during the respective receive time to the control and evaluation device during the respective receive time.

4. The method as claimed in claim 3, wherein the local coil starts the transfer of the respective low-priority magnetic resonance signals stored in the internal local coil memory during the respective receive time to the control and evaluation device, at the earliest, during a following receive pause.

5. The method as claimed in claim 3, wherein the local coil only transfers the low-priority magnetic resonance signals stored in the internal local coil memory during the receive times to the control and evaluation device in response to a request by the control and evaluation device.

6. The method as claimed in claim 3, wherein the digitized magnetic resonance signals stored in the internal local coil memory during the receive times, as a whole, form a two or three-dimensional spatial frequency space, and the high-priority magnetic resonance signals correspond to a quadrant of the two-dimensional frequency space or to an octant of the three-dimensional spatial frequency space.

7. The method as claimed in claim 3, wherein the digitized magnetic resonance signals stored in the internal local coil memory during the receive times, as a whole, form a two or three-dimensional spatial frequency space, and the high-priority magnetic resonance signals correspond to a low-frequency region of the two or three-dimensional spatial frequency space.

8. The method as claimed in claim 3, wherein the local coil transfers the high-priority magnetic resonance signals together with the low-priority magnetic resonance signals a second time to the control and evaluation device.

9. The method as claimed in claim 2, wherein the local coil only transfers the low-priority magnetic resonance signals stored in the internal local coil memory during the receive times to the control and evaluation device in response to a request by the control and evaluation device.

10. The method as claimed in claim 2, wherein the digitized magnetic resonance signals stored in the internal local coil memory during the receive times, as a whole, form a two or three-dimensional spatial frequency space, and the high-priority magnetic resonance signals correspond to a quadrant of the two-dimensional frequency space or to an octant of the three-dimensional spatial frequency space.

11. The method as claimed in claim 2, wherein the digitized magnetic resonance signals stored in the internal local coil memory during the receive times, as a whole, form a two or three-dimensional spatial frequency space, and the high-priority magnetic resonance signals correspond to a low-frequency region of the two or three-dimensional spatial frequency space.

12. The method as claimed in claim 2, wherein the local coil transfers the high-priority magnetic resonance signals together with the low-priority magnetic resonance signals a second time to the control and evaluation device.

13. The method as claimed in claim 2, wherein the number of receive antennas is greater than one, the plurality of receive antennas receiving the analog magnetic resonance signals simultaneously or quasi-simultaneously, and the digitized magnetic resonance signals are classified, at least partially, as high-priority or exclusively as low-priority at least as a function of the receive antenna that received the analog magnetic resonance signals.

14. The method as claimed in claim 13, wherein the control and evaluation device predefines, for the local coil, which of the receive antennas at least partially receive the high-priority and which of the receive antennas exclusively receive the low-priority magnetic resonance signals.

15. The method as claimed in claim 13, wherein the local coil automatically determines, from the received analog magnetic resonance signals, which of the receive antennas have received or will at least partially receive the high-priority magnetic resonance signals and which of the receive antennas have received or will receive, exclusively, the low-priority magnetic resonance signals.

16. The operating method as claimed in claim 13, wherein the receive antennas are reclassified statically or dynamically from measurement cycle to measurement cycle.

17. A local coil for magnetic resonance applications, the local coil comprising:
a plurality of receive antennas, via which analog magnetic resonance signals excited by an excitation signal in an examination object are receivable;
an analog-digital converter operable to digitize the received analog magnetic resonance signals;
an internal local coil memory with random access; and
an electronic control system operable to:
store the digitized magnetic resonance signals in a write-in sequence in the internal local coil memory;
read the digitized magnetic resonance signals out of the internal local coil memory in a read-out sequence that is different from the write-in sequence; and
transfer the digitized magnetic resonance signals to a control and evaluation device of a magnetic resonance unit according to the read-out sequence.

18. The local coil as claimed in claim 17, wherein the local coil is operable to:
receive the analog magnetic resonance signals exclusively during the receive times and stores the analog magnetic resonance signals in the internal local coil memory,
classify, at least for a part of the measurement cycles, some of the magnetic resonance signals stored in the internal local coil memory during the respective receive time as high-priority and some as low-priority magnetic resonance signals,
classify the magnetic resonance signals stored during the respective receive time in the internal local coil memory as the low-priority magnetic resonance signals for a remaining part of the measurement cycles, and
first transfer the high-priority magnetic resonance signals to the control and evaluation device and transfer the low-priority magnetic resonance signals to the control and evaluation device.

19. A magnetic resonance unit comprising:
a local coil comprising:
a plurality of receive antennas, via which analog magnetic resonance signals excited by an excitation signal in an examination object are receivable;
an analog-digital converter operable to digitize the received analog magnetic resonance signals;
an internal local coil memory with random access; and
an electronic control system operable to:
store the digitized magnetic resonance signals in a write-in sequence in the internal local coil memory;
read the digitized magnetic resonance signals out of the internal local coil memory in a read-out sequence that is different from the write-in sequence; and
transfer the digitized magnetic resonance signals to a control and evaluation device of a magnetic resonance unit according to the read-out sequence; and
a control and evaluation device in communication with the local coil.

20. The magnetic resonance unit of claim 19, wherein the local coil and the control and evaluation device interact, such that the analog magnetic resonance signals excited by the excitation signal in the examination object are received at the local coil using the plurality of receive antennas, the received analog magnetic resonance signals are digitized by the local coil, the digitized magnetic resonance signals are stored in digital form in the write-in sequence in the internal local coil memory, the digitized magnetic resonance signals stored in the internal local coil memory are read out of the internal local coil memory in the read-out sequence that is different from the write-in sequence, and the digitized magnetic resonance signals are transferred to the control and evaluation device of the magnetic resonance unit.

* * * * *